(12) United States Patent
Schram et al.

(10) Patent No.: US 7,854,877 B2
(45) Date of Patent: Dec. 21, 2010

(54) LITHOGRAPHY MEANDERING ORDER

(75) Inventors: Ivar Schram, Weert (NL); Johan Frederik Dijksman, Weert (NL); Sander Frederik Wuister, Eindhoven (NL); Yvonne Wendela Kruijt-Stegeman, Eindhoven (NL); Jeroen Herman Lammers, Eindhoven (NL); Richard Joseph Marinus Schroeders, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 71 days.

(21) Appl. No.: 11/889,585

(22) Filed: Aug. 14, 2007

(65) Prior Publication Data

US 2009/0047606 A1   Feb. 19, 2009

(51) Int. Cl.
| | |
|---|---|
| *B28B 1/14* | (2006.01) |
| *B28B 3/00* | (2006.01) |
| *B28B 3/02* | (2006.01) |
| *B28B 11/08* | (2006.01) |
| *B28B 5/02* | (2006.01) |
| *B29C 39/00* | (2006.01) |
| *B29C 41/00* | (2006.01) |
| *B29C 41/46* | (2006.01) |
| *B29C 43/02* | (2006.01) |
| *B29C 43/32* | (2006.01) |
| *B29C 51/00* | (2006.01) |
| *B29C 59/02* | (2006.01) |
| *B29C 59/00* | (2006.01) |
| *B29C 67/00* | (2006.01) |
| *B29C 35/08* | (2006.01) |
| *B27N 3/18* | (2006.01) |
| *H05B 6/00* | (2006.01) |

(52) U.S. Cl. .................. 264/299; 264/319; 264/320; 264/293; 264/294; 264/492; 264/494

(58) Field of Classification Search ............... 264/299, 264/319, 320, 293–294, 492, 494
See application file for complete search history.

(56) References Cited

U.S. PATENT DOCUMENTS

| 4,731,155 A | 3/1988 | Napoli et al. ............... 156/643 |
| 5,512,131 A | 4/1996 | Kumar et al. ............ 156/655.1 |

(Continued)

FOREIGN PATENT DOCUMENTS

EP    1 524 555 A1    4/2005

(Continued)

OTHER PUBLICATIONS

Haisma, et al., "Mold Assisted Nanolithography: A Process for Reliable Pattern Replication," J. Vac. Sci. Technol. B. 14(6), Nov./Dec. 1996, pp. 4124-4128.

(Continued)

*Primary Examiner*—Khanh Nguyen
*Assistant Examiner*—Matthew Hoover
(74) *Attorney, Agent, or Firm*—Pillsbury Winthrop Shaw Pittman LLP (57) ABSTRACT

An imprint lithography method is disclosed, which includes imprinting a plurality of patterns in an imprintable medium provided on a substrate, wherein the order in which the patterns are imprinted in the imprintable medium is such that, for the majority of the patterns, two consecutively imprinted patterns are not imprinted adjacent to one another.

13 Claims, 5 Drawing Sheets

FIG. 1A

U.S. PATENT DOCUMENTS

| | | | |
|---|---|---|---|
| 5,772,905 A | 6/1998 | Chou | 216/44 |
| 6,165,911 A | 12/2000 | Calveley | 438/754 |
| 6,180,239 B1 | 1/2001 | Whitesides et al. | 428/411.1 |
| 6,309,580 B1 | 10/2001 | Chou | 264/338 |
| 6,334,960 B1 | 1/2002 | Willson et al. | 216/52 |
| 6,365,059 B1 | 4/2002 | Pechenik | 216/52 |
| 6,375,870 B1 | 4/2002 | Visovsky et al. | 264/1.31 |
| 6,482,742 B1 | 11/2002 | Chou | 438/690 |
| 6,518,189 B1 | 2/2003 | Chou | 438/706 |
| 6,656,341 B2 | 12/2003 | Petersson et al. | 205/667 |
| 6,696,220 B2 | 2/2004 | Bailey et al. | 430/272.1 |
| 6,719,915 B2 | 4/2004 | Willson et al. | 216/44 |
| 6,921,615 B2 | 7/2005 | Sreenivasan et al. | 430/22 |
| 6,929,762 B2 * | 8/2005 | Rubin | 264/40.1 |
| 6,949,199 B1 * | 9/2005 | Gauzner et al. | 216/2 |
| 2002/0093122 A1 | 7/2002 | Choi et al. | 264/401 |
| 2002/0094496 A1 | 7/2002 | Choi et al. | 430/322 |
| 2002/0132482 A1 | 9/2002 | Chou | 438/692 |
| 2002/0167117 A1 | 11/2002 | Chou | 264/338 |
| 2002/0177319 A1 | 11/2002 | Chou | 438/690 |
| 2003/0034329 A1 | 2/2003 | Chou | 216/44 |
| 2003/0080471 A1 | 5/2003 | Chou | 264/338 |
| 2003/0080472 A1 | 5/2003 | Chou | 264/338 |
| 2003/0081193 A1 | 5/2003 | White et al. | 355/72 |
| 2003/0127580 A1 | 7/2003 | Ling et al. | 249/115 |
| 2003/0139042 A1 | 7/2003 | Heidari | 438/689 |
| 2003/0141291 A1 | 7/2003 | Heidari et al. | 219/460.1 |
| 2003/0159608 A1 | 8/2003 | Heidari | 101/494 |
| 2003/0170053 A1 | 9/2003 | Montelius et al. | 399/318 |
| 2003/0189273 A1 | 10/2003 | Olsson | 264/293 |
| 2004/0005444 A1 | 1/2004 | Heidari | 428/212 |
| 2004/0009673 A1 | 1/2004 | Sreenivasan et al. | 438/694 |
| 2004/0021866 A1 | 2/2004 | Watts et al. | 356/401 |
| 2004/0022888 A1 | 2/2004 | Sreenivasan et al. | 425/174.4 |
| 2004/0036201 A1 | 2/2004 | Chou et al. | 264/402 |
| 2004/0046288 A1 | 3/2004 | Chou | 264/479 |
| 2004/0081798 A1 | 4/2004 | Lee et al. | 428/141 |
| 2004/0124566 A1 | 7/2004 | Sreenivasan et al. | 264/494 |
| 2004/0149367 A1 | 8/2004 | Olsson et al. | 156/64 |
| 2004/0169003 A1 | 9/2004 | Lee et al. | 216/4 |
| 2004/0192041 A1 | 9/2004 | Jeong et al. | 438/689 |
| 2004/0200411 A1 | 10/2004 | Willson et al. | 118/500 |
| 2004/0209470 A1 | 10/2004 | Bajorek | 438/689 |
| 2004/0219249 A1 | 11/2004 | Chung et al. | 425/385 |
| 2004/0219461 A1 | 11/2004 | Chung et al. | 430/311 |
| 2004/0256576 A1 * | 12/2004 | Gierak et al. | 250/492.3 |
| 2005/0039618 A1 | 2/2005 | Heidari et al. | 101/368 |
| 2005/0064054 A1 | 3/2005 | Kasumi | 425/112 |
| 2005/0146079 A1 * | 7/2005 | Chou | 264/319 |
| 2005/0159019 A1 | 7/2005 | Lee | 438/800 |
| 2005/0178280 A1 | 8/2005 | Lee et al. | |
| 2005/0274693 A1 | 12/2005 | Heidari et al. | 216/52 |
| 2006/0076717 A1 * | 4/2006 | Sreenivasan et al. | 264/494 |
| 2006/0144274 A1 * | 7/2006 | Kolesnychenko et al. | 101/483 |
| 2006/0144275 A1 * | 7/2006 | Kolesnychenko et al. | 101/483 |
| 2007/0164487 A1 | 7/2007 | Beck et al. | |

FOREIGN PATENT DOCUMENTS

| | | |
|---|---|---|
| EP | 1524555 A1 * | 4/2005 |
| EP | 1 762 893 A1 | 3/2007 |
| EP | 1762893 A1 * | 3/2007 |
| WO | WO 01/79591 A1 | 10/2001 |
| WO | WO 01/79592 A1 | 10/2001 |
| WO | WO 02/67055 A2 | 8/2002 |

OTHER PUBLICATIONS

Partial European Search Report for European Application No. 08 25 2658 dated Jun. 4, 2009.

* cited by examiner

LITHOGRAPHY MEANDERING ORDER

FIELD

The present invention relates to lithography in general and, particularly, to imprint lithography.

BACKGROUND

In lithography, there is an ongoing desire to reduce the size of features in a lithographic pattern to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography, which generally involves the use of a "stamp" to transfer a pattern onto a substrate. An advantage of imprint lithography is that the resolution of the features is not limited by, for example, the wavelength of a radiation source or the numerical aperture of a projection system as in photolithography, but mainly just by the pattern density on the stamp (also referred to as a template). There are three main approaches to imprint lithography, examples of which are schematically depicted in FIGS. 1a to 1c.

Figure 1A:
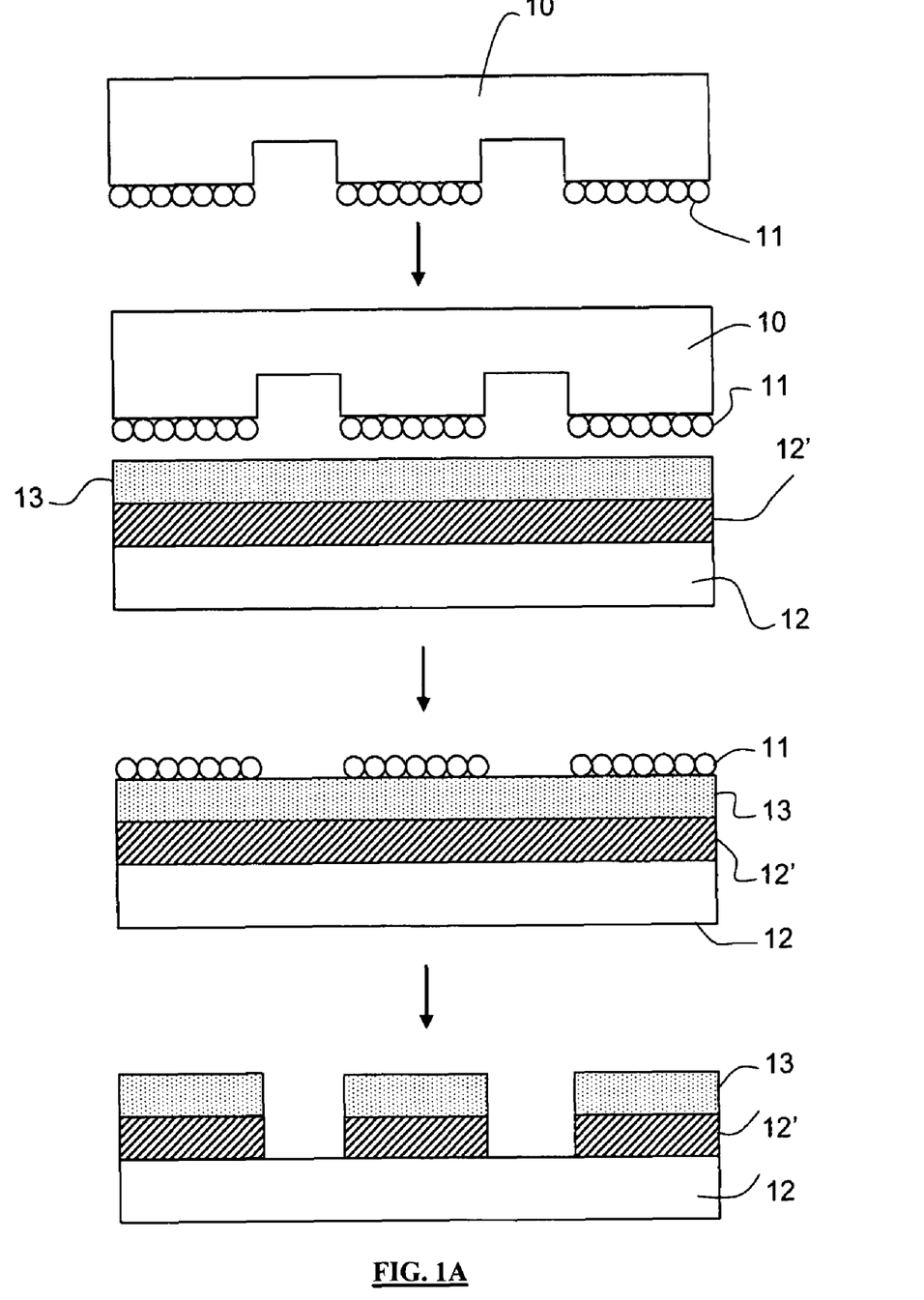
FIGS. 1a-c schematically show examples of, respectively, micro-contact printing, hot imprint, and UV imprint.

FIG. 1a shows an example of a type of imprint lithography that is often referred to as micro-contact printing. Micro-contact printing involves transferring a layer of molecules 11 (typically an ink such as a thiol) from a template 10 (e.g. a polydimethylsiloxane template) onto a resist layer 13 which is supported by a substrate 12 and planarization and transfer layer 12'. The template 10 has a pattern of features on its surface, the molecular layer being disposed upon the features. When the template is pressed against the resist layer, the layer of molecules 11 are transferred onto the resist. After removal of the template, the resist is etched such that the areas of the resist not covered by the transferred molecular layer are etched down to the substrate. For more information on micro-contact printing, see for example, U.S. Pat. No. 6,180,239.

Figure 1B:
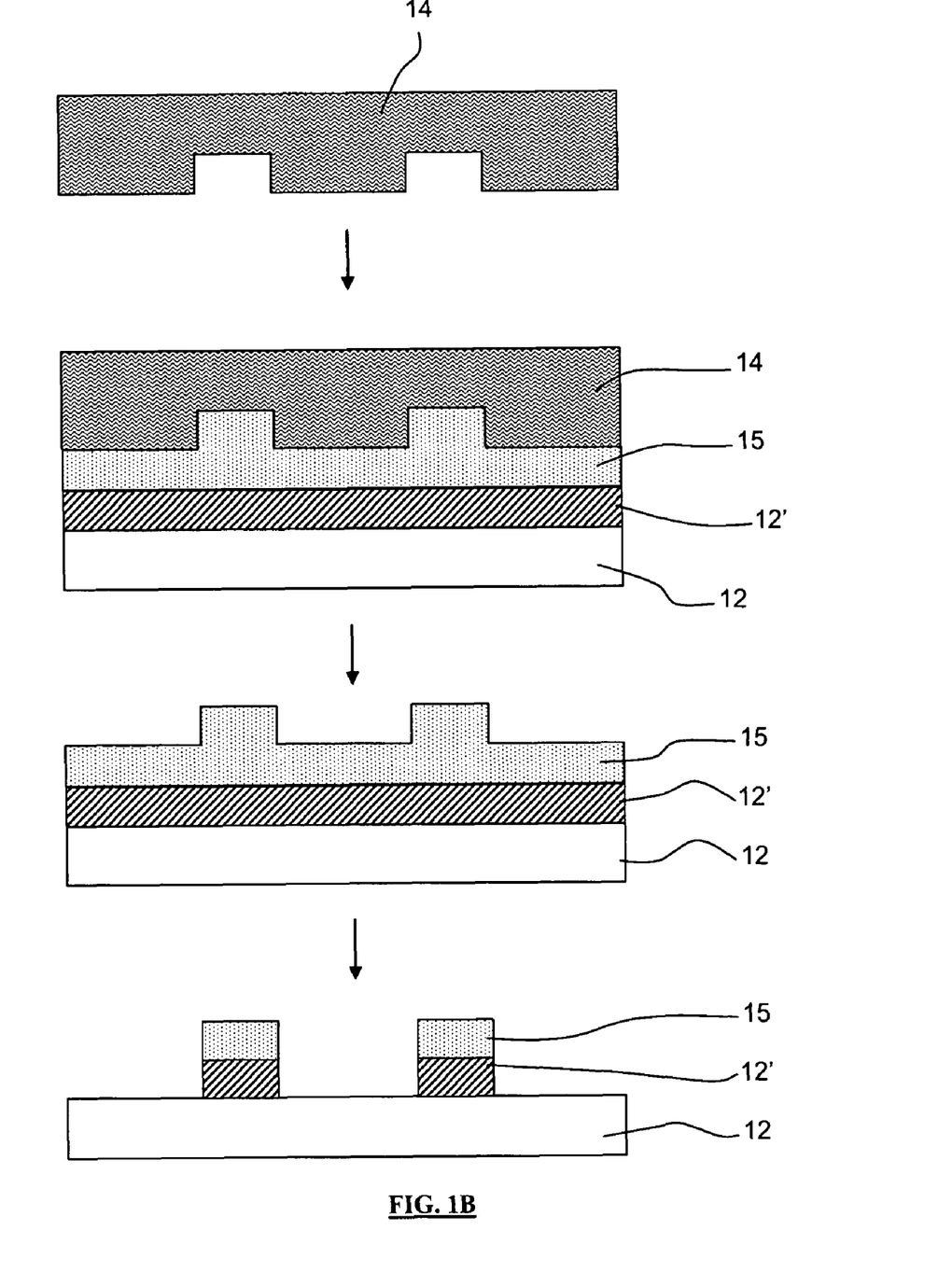

FIG. 1b shows an example of so-called hot imprint lithography (or hot embossing). In a typical hot imprint process, a template 14 is imprinted into a thermosetting or a thermoplastic polymer resin 15 (or more generally an imprintable medium), which is on the surface of a substrate 12. The resin may, for instance, be spin coated and baked onto the substrate surface or, as in the example illustrated, onto a planarization and transfer layer 12'. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template may then be removed and the patterned resin cooled. In hot imprint lithography employing a layer of thermoplastic polymer resin, the thermoplastic resin is heated so that it is in a freely flowable state immediately prior to imprinting with the template. It may be necessary to heat a thermoplastic resin to a temperature considerably above the glass transition temperature of the resin. The template is pressed into the flowable resin and then cooled to below its glass transition temperature with the template in place to harden the pattern. Thereafter, the template is removed. The pattern will consist of the features in relief from a residual layer of the resin which residual layer may then be removed by an appropriate etch process to leave only the pattern features. Examples of thermoplastic polymer resin used in hot imprint lithography processes are poly (methyl methacrylate), polystyrene, poly (benzyl methacrylate) or poly (cyclohexyl methacrylate). For more information on hot imprint, see for example, U.S. Pat. No. 4,731,155 and U.S. Pat. No. 5,772,905.

Figure 1C:
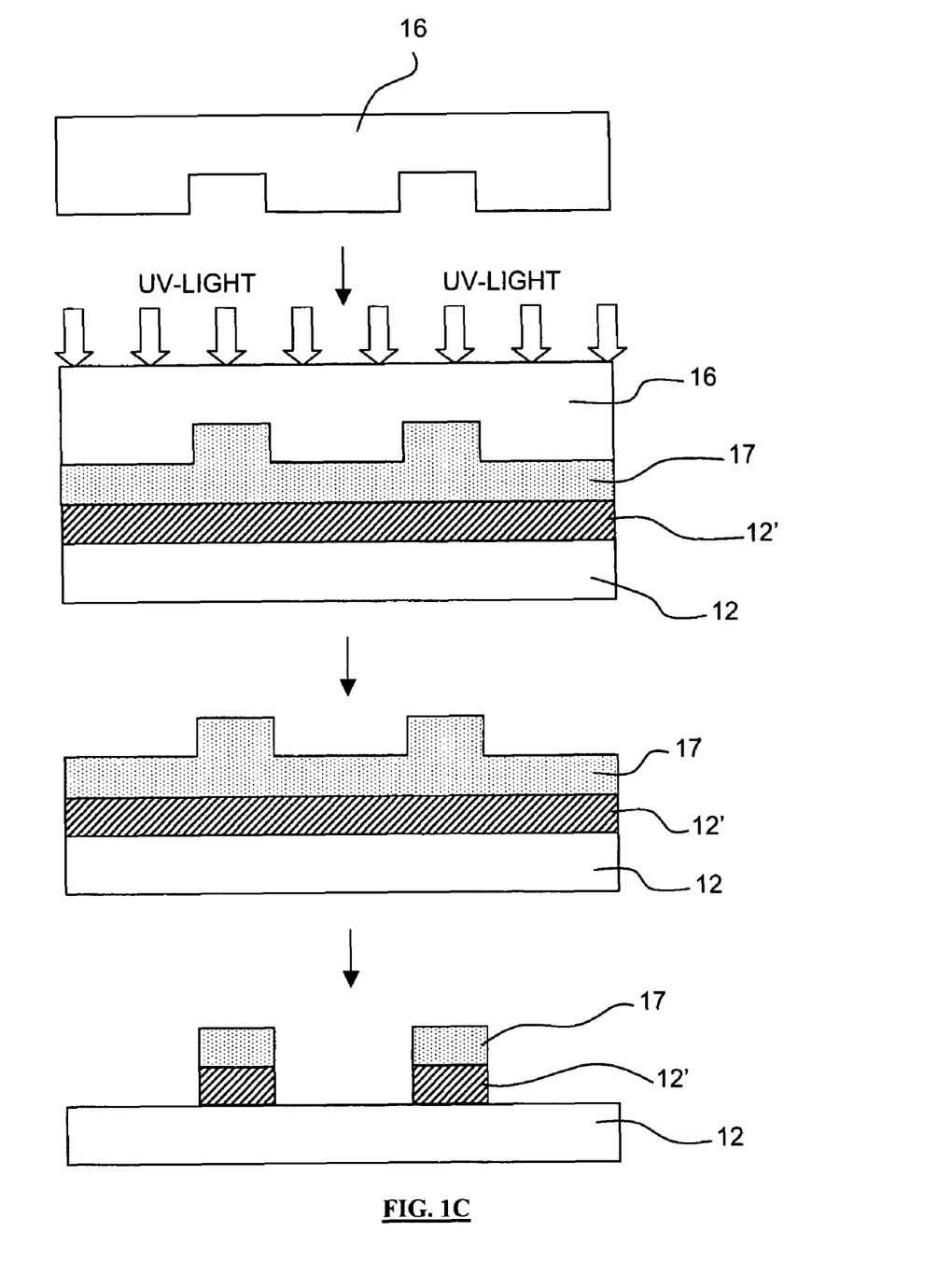

FIG. 1c shows an example of ultraviolet (UV) imprint lithography, which involves the use of a transparent template and a UV-curable liquid as imprintable medium (the term "UV" is used here for convenience but should be interpreted as including any suitable actinic radiation for curing the resist). An UV curable liquid is often less viscous than the thermosetting and thermoplastic resins used in hot imprint lithography and consequently may move much faster to fill template pattern features. A quartz template 16 is applied to a UV-curable resin 17 in a similar manner to the process of FIG. 1b. However, instead of using heat or temperature cycling as in hot imprint, the pattern is frozen by curing the resin with UV radiation that is applied through the quartz template onto the resin. After removal of the template, the pattern will consist of the features in relief from a residual layer of the resin which residual layer may then be removed by an appropriate etch process to leave only the pattern features. A particular manner of patterning a substrate through UV imprint lithography is so-called step and flash imprint lithography (SFIL), which may be used to pattern a substrate in small steps in a similar manner to optical steppers conventionally used in photolithography. For more information on UV imprint, see for example, United States patent application publication no. US 2004-0124566, U.S. Pat. No. 6,334,960, PCT patent application publication no. WO 02/067055, and the article by J. Haisma entitled "Mold-assisted nanolithography: A process for reliable pattern replication", J. Vac. Sci. Technol. B14(6), November/December 1996.

Combinations of the above imprint techniques are also possible. See, for example, United States patent application publication no. US 2005-0274693, which mentions a combination of heating and UV curing an imprintable medium.

SUMMARY

When applying a pattern to a substrate using imprint lithography, a magnification error may occur. A magnification error can arise, for instance, due to a difference in temperature of the region in which a pattern is imprinted from an expected or design temperature. For example, the temperature may affect the properties of the region of the substrate upon which imprint medium has been deposited and in which a pattern is to be imprinted. For example, there may be relative expansion or contraction of parts of the substrate due to a difference in temperature of those parts of the substrate. Alternatively or additionally, a magnification error can arise if the temperature of the imprint template changes, for example, between imprints. Such a magnification error may be different for the patterns imprinted on different parts of a substrate. If the patterns are not consistent with one another, devices which are formed from these patterns may, e.g., not function consistently with respect to one another.

It is an aim of the present invention to provide an imprint lithography method and apparatus that may obviate or mitigate a disadvantage of the prior art, whether identified herein or elsewhere.

According to an embodiment, there is provided an imprint lithography method, comprising: imprinting a plurality of patterns in an imprintable medium provided on a substrate, wherein the order in which the patterns are imprinted in the imprintable medium is such that, for the majority of the patterns, two consecutively imprinted patterns are not imprinted adjacent to one another.

According to an embodiment, there is provided an imprint lithography apparatus comprising: an imprint template holder configured to hold an imprint template; a substrate holder configured to hold a substrate; and a controller configured to control movement of the imprint template, the substrate, or both the imprint template and the substrate, in such a way that the order in which a plurality of patterns are imprinted, using the imprint template, in an imprintable medium provided on the substrate is such that, for the majority of the patterns, two consecutively imprinted patterns are not imprinted adjacent to one another.

According to an embodiment, there is provided an imprint lithography method comprising: heating an imprint template, prior to using the imprint template to imprint a pattern in an imprintable medium on a substrate.

According to an embodiment, there is provided a lithographic method comprising: projecting a plurality of patterns onto a substrate using a patterned radiation beam, wherein the order in which the patterns are projected onto the substrate is such that, for the majority of the patterns, two consecutively projected patterns are not projected adjacent to one another.

According to an embodiment, there is provided a lithographic apparatus comprising: a support structure configured hold a patterning device, the patterning device serving to impart a radiation beam with a pattern in its cross-section; a substrate table configured to hold a substrate; a projection system configured to project the patterned radiation beam onto the substrate; and a controller configured to control movement of (i) the substrate, (ii) the patterning device, (iii) the projection system, or (iv) any combination selected from (i)-(iii) in such a way that the order in which a plurality of patterns is projected onto the substrate is such that, for the majority of the patterns, two consecutively projected patterns are not projected adjacent to one another.

BRIEF DESCRIPTION OF THE DRAWINGS

FIG. 2a schematically depicts the order in which patterns are applied to a substrate according to an imprint lithography method;

FIG. 2b depicts the relative movement between the substrate and an imprint template as patterns are applied to the substrate according to the method depicted in FIG. 2a;

FIG. 2c schematically depicts the magnification error in a pattern applied to the substrate using the imprint lithography method shown in FIG. 2a;

FIG. 3b depicts the relative movement between the substrate and an imprint template as patterns are applied to the substrate according to the method depicted in FIG. 3a; and FIG. 3c schematically depicts the magnification error in a pattern applied to the substrate using the lithography method shown in FIG. 3a.

DETAILED DESCRIPTION

Figures 2A, 2B:
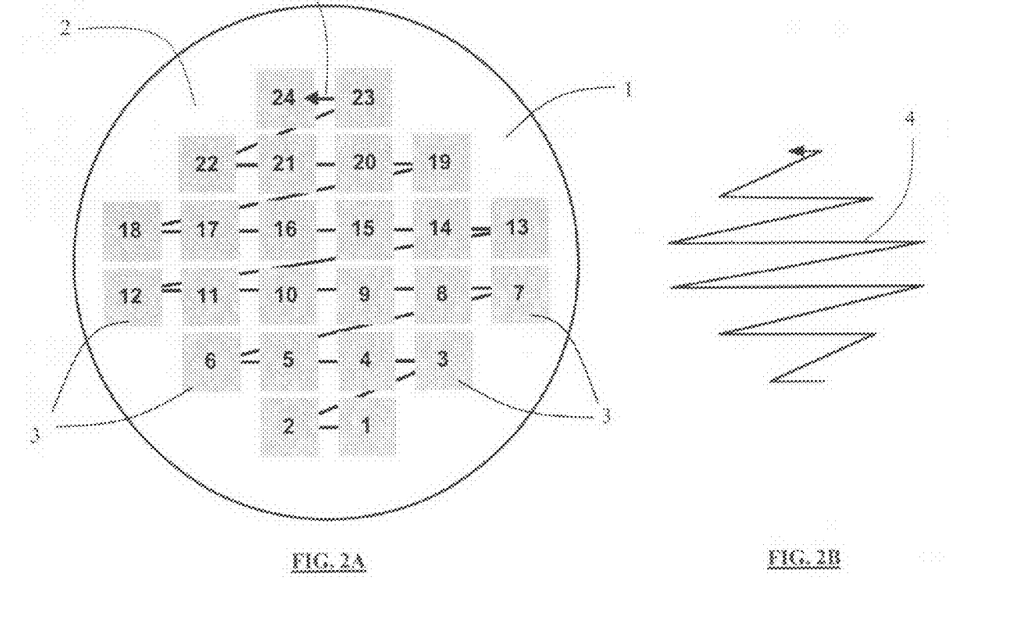

FIG. 2a depicts a substrate 1 which has been provided with a layer of imprintable medium 2. An imprint template (not shown) has been used to imprint twenty-four individual patterns 3 in the imprintable medium. The numerical order in which the patterns 3 are imprinted in the imprintable medium 2 is shown in the Figure. As well as illustrating the order in which the patterns 3 are imprinted in the imprintable medium 2, the relative movement between the substrate 1 and the imprint template to imprint each pattern 3 is shown by a path 4. For clarity, FIG. 2b illustrates this path 4 in isolation. It can be seen that the patterns 3 are imprinted in a series of rows.

Referring back to FIG. 2a, and as described in more detail above, each pattern 3 is frozen by heating the pattern 3 or by exposing it to actinic radiation. In freezing the pattern 3, both the imprint template, substrate 1, and imprintable medium 2 between the imprint template and substrate 1 are heated up (e.g. by a heating element or by actinic radiation). After the pattern 3 has been frozen, the imprint template is moved away from the imprintable medium 2 (and/or the imprintable medium 2 is moved away from the imprint template). The substrate 1, pattern 3 and imprint template then begin to cool down. Each of the substrate 1, imprintable medium 2 and imprint template have a different thermal conductivity, meaning that the substrate 1, imprintable medium 2 and imprint template cool down at different rates when no longer heated. After the imprint template has been used to apply a few patterns 3 in the imprintable medium 2, the imprint template should reach a steady state temperature, where after the temperature of the imprint template should not vary very much. For some imprint lithography methods and apparatus, it may take around seven imprints for the imprint template to reach a steady state temperature. However, the substrate 1 does not reach this steady state temperature, and instead gets heated up every time a pattern 3 is frozen.

The substrate 1 tends to lose any heat with which it is provided slowly. This means that heat from of a part of a substrate 1 heated when a pattern 3 is frozen may conduct to other adjacent areas of the substrate 1 and/or imprintable medium 2. The heating of the imprintable medium 2 and/or substrate 1 causes previous and/or subsequent patterns 3 to be subjected to different thermal properties. This means that successive patterns 3 may be exposed to different substrate temperatures, for example. Different temperatures of the substrate 1 and/or imprintable medium 2 may result in the expansion and/or relative contraction of different patterns 3. This means that the features of different patterns 3 imprinted in the imprintable medium 2 may be different to each other, and/or may be different to the pattern of the imprint template itself. Such a difference is known as a magnification error.

Figure 2C:
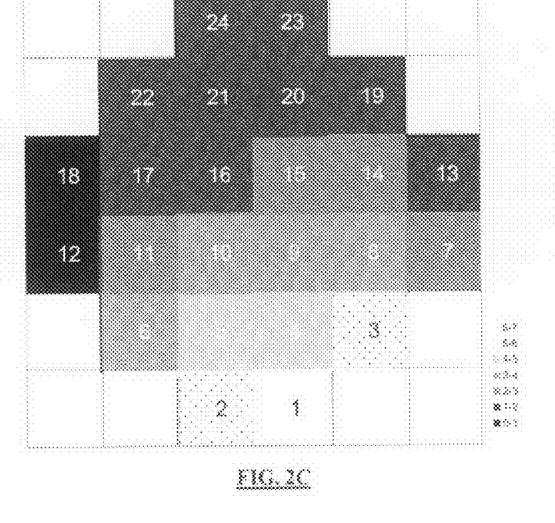

FIG. 2c depicts the magnification errors for the patterns 3 imprinted in the imprintable medium 2. The magnification error for each applied pattern is represented by the darkness of the shading of the square representing each pattern—the lighter the pattern, the greater the magnification error. It can be seen that, for the first ten imprint patterns at least, the magnification errors are quite high. This can be attributed to two main factors. The first factor is the accumulative heating of the substrate 1 and imprintable medium 2 by the freezing of patterns 3, as described above. A second factor is that for the first few imprints, the imprint template has not yet reached a steady state temperature, meaning that the temperature of the imprint template is gradually increasing over the first few imprints. This means that the imprintable medium 2 used to form the first few patterns 3, and the areas of the substrate beneath these patterns 3, are not subjected to the same temperatures as later areas of imprintable medium 2 and substrate 1, at which point the imprint template has reached a steady state temperature.

As mentioned above, it is desirable to reduce or minimize the magnification error of a pattern imprinted on a substrate so that, for example, any device fabricated from this pattern behaves or operates in a substantially similar and/or consistent manner. Even if the magnification error cannot be reduced (perhaps even fully eliminated) or minimized, it is desirable that any magnification error which remains in a pattern is as similar as possible as other patterns applied to the same substrate. This is because the more similar the magnification errors are between patterns, the easier it is to correct for them. For example, a common correction factor could be made to one or both of the imprint template and substrate. For example, the temperature of the imprint template and/or the temperature of the substrate could be adjusted. Alternatively or additionally, the imprint template and/or the substrate could be compressed or expanded slightly to counteract the contribution of the thermal change to the magnification error.

A problem of imprint lithography methods include the fact that the first few imprints are not consistent due to the fact that the imprint template has not yet reached a steady state temperature, and that the order in which the patterns are imprinted causes adjacent patterns to be subjected to different thermal conditions.

In an embodiment, a problem with regards to the steady state temperature of the imprint template is decreased or overcome by undertaking one or more dummy imprints before the imprintable medium on the substrate is imprinted. For example, the imprint template could be used to imprint dummy patterns on a dummy substrate in order to bring the imprint template up to its steady state temperature. That is, during the dummy imprint stage the imprint template will be provided with enough heat from a direct heating source, or a source of actinic radiation, to bring the imprint template up to a steady state temperature. Alternatively or additionally, the imprint template could be heated for a sufficient period of time and at a sufficient temperature to ensure that a steady temperature is reached before the imprinting of imprintable medium on a substrate is undertaken. The imprint template could be heated using a heat source or a radiation source. The heating process can be configured to effectively mimic an imprint freezing step, such that the applied heat (e.g. radiation dose, or thermal energy) is the same or similar as that which would be required to freeze an imprinted pattern. One or more heating steps may be employed, again mimicking one or more pattern freezing processes. Using one or both of the dummy imprint and heating methods, the magnification error of the first few imprints will be reduced, since the temperature of the imprint template will not be changing rapidly over those first few imprints. As mentioned above, for some imprint lithography methods and apparatus, it may take around seven imprints for the imprint template to reach a steady state temperature. Therefore, if dummy imprints are used, seven dummy imprints (including the pattern freezing process) may be desirable. Similarly, if the heating method is used, sufficient heat may be provided to the imprint template to mimic the heat generated in seven imprints (including the pattern freezing process). In a combination of dummy imprints and heating, the combination of a number of dummy imprints and an amount of heating may combine to be equivalent to seven imprints (including the pattern freezing process).

According to an embodiment, in order to reduce or eliminate the thermal effects of a given imprint on subsequent imprints, the order in which patterns are applied in the imprintable medium on the substrate is changed. For example, referring to FIGS. 2a and 2b, it can be seen that in these imprint lithography methods, the imprint template and/or substrate is scanned relative to the other such that rows or columns of patterns are successively applied in the imprintable medium. This means that the thermal effects of one imprint have an affect on subsequent and adjacent imprints. In an embodiment, the patterns are imprinted in such a sequence that, at least for the majority of imprints, two (or more, e.g. three, four, or five) consecutively imprinted patterns are not imprinted adjacent to another.

Figure 3A:
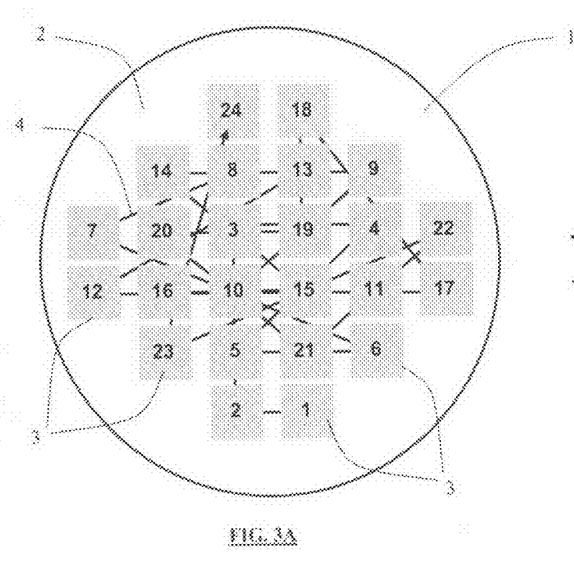
FIG. 3a schematically depicts the order in which patterns are applied to a substrate according to an embodiment of the present invention.
Figure 3B:
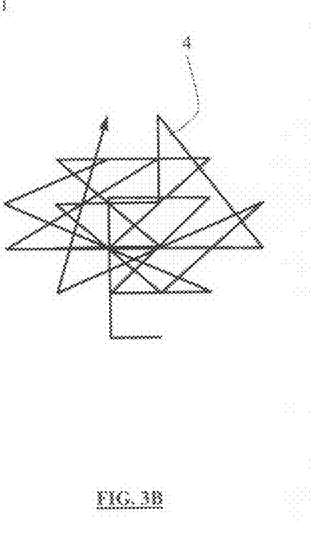

FIG. 3a depicts an imprint lithography method according to an embodiment of the present invention. FIG. 3a depicts the numerical order in which the patterns 3 are imprinted in the imprintable medium 2 on the substrate 1. A path 4 of the relative movement between the imprint template (not shown) and the substrate 1 is shown. Referring to FIG. 3b, the path 4 is shown in isolation for clarity. The patterns 3 are not imprinted in the imprintable medium 2 in successive rows or columns.

Referring to FIGS. 3a and 3b, it can be seen that very few adjacent patterns 3 are imprinted in immediate succession of one another. In other words, the majority of patterns 3 applied to the substrate 1 are imprinted such that at least one pattern space separates a newly imprinted pattern and an imprint pattern immediately applied beforehand. A pattern space may be an imprinted pattern, or an unpatterned area of imprintable medium 2 sufficient in area to be patterned by the imprint template. It can be seen that only the first and second patterns 3 are imprinted adjacent to one another and in immediate succession. These patterns 3 are printed adjacent to each other in immediate succession to ensure that the imprint system is in correct alignment. Alternatively, two non-adjacent patterns could be used to test whether the imprint system is in correct alignment, for example two patterns in the same row or column, or two patterns opposite one another in a row, column or along a diagonal. If alignment was not needed, or could be checked in another way no imprint patterns would have to be printed next to one another in immediate succession.

The patterns 3 could be imprinted on the imprintable medium 2 in any order, so long as the number of patterns imprinted adjacent to one another and in immediate succession is reduced when compared to prior art techniques. For example, a random imprinting order may be sufficient, or one where the patterns are printed in an order which guarantees that only a limited number (and possibly a predetermined number) are printed adjacent to one another in succession.

Figure 3C:
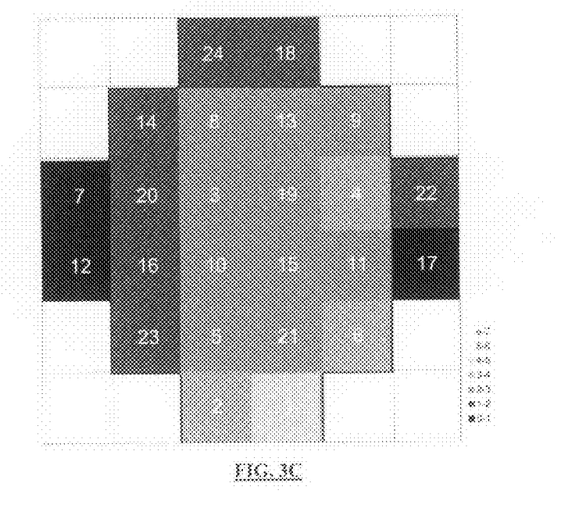

FIG. 3c shows the magnification errors of the patterns applied to the substrate using the method described in FIG. 3a. The lighter the pattern, the greater the magnification error. It can be seen that although there still are magnification errors, the magnification errors are more consistent and less variable between patterns when compared to FIG. 2c.

It can be seen from a comparison of FIGS. 2c and 3c that for all imprinted patterns, the difference between the lowest magnification error and the highest magnification error (i.e. the peak-to-peak error) is lowest for the substrate in FIG. 3c. That is, the magnification errors do not vary as much across the entire set of patterns imprinted on the substrate in FIG. 3c. As described above, this means that the magnification errors can be corrected more easily.

A method according to an embodiment of the present invention may be implemented by a controller, such as a computer or embedded processor or the like suitably electronically configured and/or programmed. The controller could be arranged to move a holder which holds the substrate, and/or be arranged to move the imprint template to effect the imprint order described above in relation to FIGS. 3a to 3c.

The imprinting order according to, for instance, FIG. 3 involves imprinting patterns at locations on the substrate which are not in ordered rows, meaning that the movement between the substrate and the imprint template may be greater than the order of one pattern size between imprints. Even though the relative movement between the substrate and the imprint template is greater using the method according to, e.g., FIG. 3, the throughput may not be greatly affected (if at all). This is because a large portion of the time between successive imprints is generally taken up with the imprint process itself (e.g. lowering of the imprint template to imprint a pattern, freezing of the pattern, retraction of the imprint template, etc.), and not necessarily movement of the substrate and/or the imprint template itself. Due to the speed of movement of the imprint template and/or substrate, this means that the overall time of movement of the imprint template and/or the substrate may be only slightly increased.

Although the above embodiments have been described in relation to imprint lithography, the invention may find use in irradiative (e.g. optical) lithography where patterns are applied to a layer of radiation sensitive material using a radiation beam. According to an embodiment of the present invention, in order to reduce or eliminate the thermal effect of a given optically applied pattern on one or more subsequent optically applied patterns, the order in which patterns are applied to, for example, resist on a substrate is different from that of the prior art. For example, in prior art optical lithography methods, optical elements (e.g. mask, reticle, etc.) and/or the substrate are scanned relative to one another such that rows or columns of patterns are successively applied (i.e. projected onto) to the resist. This means that the thermal effect of one applied pattern has an effect on one or more subsequent and adjacent applied patterns. According to an embodiment of the present invention, the patterns are not optically applied to the substrate in successive rows and/or columns. Instead, as described above in relation to imprints, the majority of patterns optically applied to the resist are applied in an order wherein at least one pattern space separates a newly applied pattern and a pattern immediately applied beforehand. In other words, the order in which the patterns are optically applied to the resist is such that, for the majority of the patterns, two consecutively applied patterns (or more, e.g. three, four, or five consecutively applied patterns) are not applied adjacent to one another. The optical embodiment of the present invention may have any of the features described above in relation to the imprint embodiments described above.

For an optical lithography embodiment, a lithographic apparatus may be provided, the lithographic apparatus comprising a support structure configured hold a patterning device, the patterning device serving to impart a radiation beam with a pattern in its cross-section, a substrate table configured to hold a substrate, a projection system configured to project the patterned radiation beam onto the substrate, and a controller configured to control movement of (i) the substrate, (ii) the patterning device, (iii) the projection system, or (iv) any combination selected from (i)-(iii) in accordance with any of the methods described herein. For example, the controller may be configured to control such movement in a way that the order in which a plurality of patterns is projected onto the substrate is such that, for the majority of the patterns, two consecutively projected patterns are not projected adjacent to one another.

It will be appreciated that the above embodiments have been described by way of example only. It will be appreciated that various modifications may be made to these and indeed other embodiments without departing from the invention which is defined by the claims that follow.

What is claimed is:

1. An imprint lithography method, comprising:
  imprinting a plurality of patterns in an imprintable medium provided on a substrate using an imprint template,
  wherein the order in which the patterns are imprinted in the imprintable medium is such that, for the majority of the patterns, two consecutively imprinted patterns are not imprinted adjacent to one another, and
  wherein, prior to imprinting the plurality of patterns in the imprintable medium provided on the substrate, the imprint template is heated by using the imprint template to perform a dummy imprint such that the imprint template is at a substantially steady state temperature when the plurality of patterns is imprinted in the imprintable medium.

2. The method of claim 1, wherein, for the majority of patterns, consecutively imprinted patterns are spaced apart by a pattern space.

3. The method of claim 2, wherein the pattern space is occupied by a pattern previously imprinted in the imprintable medium.

4. The method of claim 2, wherein the pattern space is an unpatterned area of imprintable medium having an area substantially equal to that of a pattern to be imprinted.

5. The method of claim 1, wherein the order in which the patterns are imprinted in the imprintable medium is such that, for all of the patterns, two consecutively imprinted patterns are not imprinted adjacent to one another.

6. The method of claim 1, wherein the imprint template is heated by exposing the imprint template to radiation.

7. The method of claim 6, wherein the imprint template is exposed to the radiation on more than one occasion.

8. The method of claim 6, wherein the imprint template is exposed to the same dose of radiation as would be required to freeze an imprinted pattern in the imprintable medium.

9. The method of claim 1, wherein the imprint template is heated by exposing the imprint template to a heat source.

10. The method of claim 9, wherein the imprint template is exposed to the heat source on more than one occasion.

11. The method of claim 9, wherein the imprint template is exposed to a substantially same amount of thermal energy as would be required to freeze an imprinted pattern in the imprintable medium.

12. The method of claim 1, wherein the dummy imprint comprises imprinting a layer of imprintable medium with a pattern and freezing the pattern in the imprintable medium, the layer of imprintable medium being provided on a surface other that of the substrate.

13. The method of claim 1, wherein the imprint template is heated by using the imprint template to perform seven dummy imprints.

* * * * *